United States Patent [19]
Choi et al.

[11] Patent Number: 6,009,040
[45] Date of Patent: Dec. 28, 1999

[54] APPARATUS AND METHODS FOR CONTROLLING SENSING TIME IN A MEMORY DEVICE

[75] Inventors: Byeng-Soon Choi, Kyunggi-do; Young-Ho Lim, Suwon, both of Rep. of Korea

[73] Assignee: Samsung Electronics Co., Ltd., Rep. of Korea

[21] Appl. No.: 09/216,455

[22] Filed: Dec. 18, 1998

[30] Foreign Application Priority Data

Dec. 29, 1997 [KR] Rep. of Korea ............ 97-77269

[51] Int. Cl.⁶ .................................. G11C 8/00
[52] U.S. Cl. .............. 365/233; 365/185.03; 365/185.2; 365/189.09; 365/210; 365/230.08; 365/194; 365/196; 365/168; 365/236
[58] Field of Search ............ 365/185.03, 189.09, 365/210, 185.2, 233, 230.08, 194, 196, 168, 236

[56] References Cited

U.S. PATENT DOCUMENTS 5,457,650 10/1995 Sugiura et al. .............. 365/184
5,761,132 6/1998 Kim .............................. 365/189.05

*Primary Examiner*—Andrew Q. Tran
*Attorney, Agent, or Firm*—Myers Bigel Sibley & Sajovec

[57] ABSTRACT

An apparatus for controlling reading of memory cells in a memory device includes a word line voltage generator operative to apply a word line voltage to a selected memory cell of memory device responsive to a sensing period signal. A dummy memory cell is coupled to the word line voltage generator such that the word line voltage is applied to the dummy memory cell, the dummy memory cell having a threshold voltage. A sensing period controller is coupled to the dummy memory cell and operative to produce the sensing period signal responsive to a current generated in the dummy memory cell. According to an embodiment of the present invention, the sensing period controller includes a dummy sense amplifier coupled to the dummy memory cell and operative to produce a dummy cell sense amplifier output signal responsive to a current in the dummy memory cell. A sensing time detector is coupled to the dummy sense amplifier and operative to produce a sensing time signal in response to a transition of the dummy cell sense amplifier output signal. A sensing period signal generator is coupled to the sensing time detector and operative to generate the sensing period signal responsive to the sensing time signal. Apparatus for controlling sensing periods in a multi-level memory device, as well as related operating methods, are also described.

29 Claims, 10 Drawing Sheets

Fig. 4
(Prior Art)
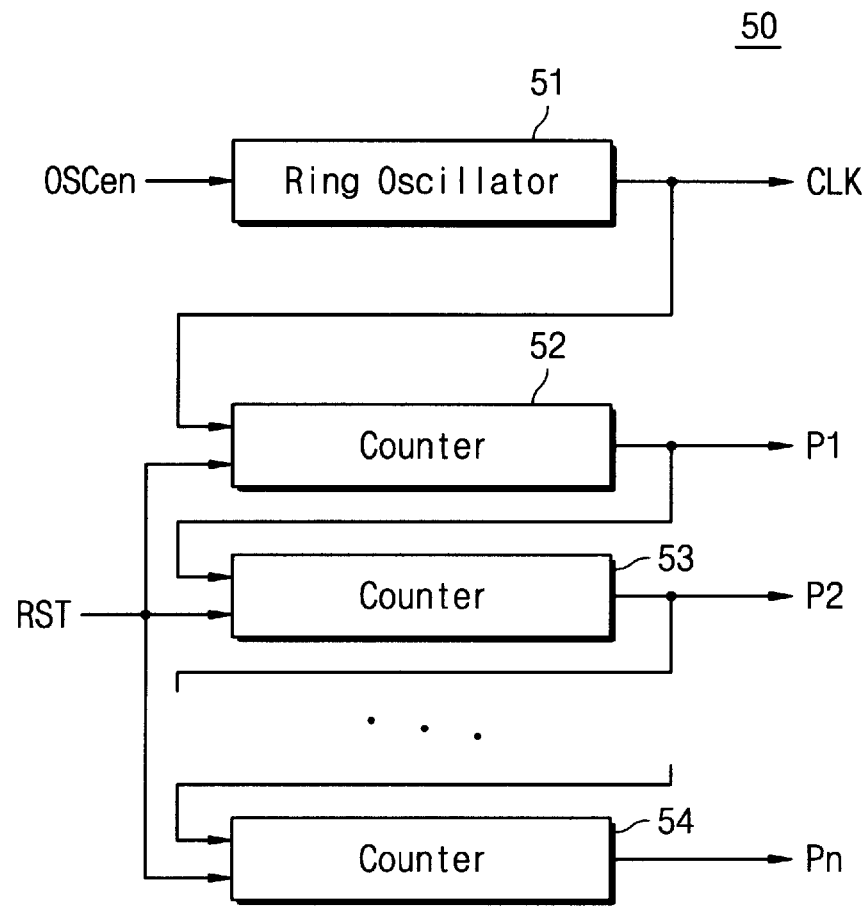
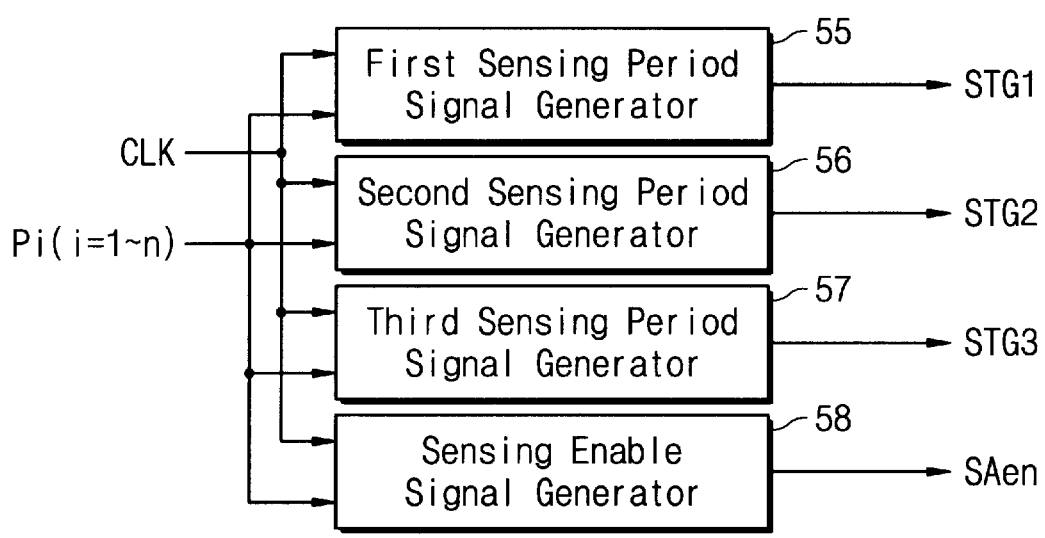

APPARATUS AND METHODS FOR CONTROLLING SENSING TIME IN A MEMORY DEVICE

FIELD OF THE INVENTION

The present invention relates to integrated circuit devices and, more particularly, to memory devices and methods of operation thereof.

BACKGROUND OF THE INVENTION

Conventional nonvolatile memory devices include mask read-only memories (ROMs), electrically erasable programmable read-only memories (EEPROMs), and flash EEPROMs. These conventional nonvolatile memory devices typically include memory cells that can store one of two information states, e.g., an "ON" state and an "OFF" state, In order to store N-bits of data, N single-bit memory cells are typically used.

Many conventional transistor-type one-bit memory cells define logical states using the threshold voltage of a transistor, i.e., the state of data stored in a transistor may be distinguished by the level of the threshold voltage of the transistor. In a typical mask ROM, threshold voltage for a cell transistor is controlled by injection of ions using ion implantation techniques. In typical EPROMs, EEPROMs and flash EEPROMs, threshold voltage for a cell transistor is controlled by controlling the amount of charge stored in a floating gate of the transistor.

Threshold voltage control can be used to implement a transistor memory cell that is capable of representing multiple bits of information. For example, as illustrated in FIG. 1, cell transistors of a mask ROM may be programmed with logical values "00", "01", "10" or "11", by setting their threshold levels at a value falling within one of four ranges around nominal threshold voltages Vth1, Vth2, Vth3, Vth4.

FIG. 2 is a diagram showing a voltage variation applied to a word line during a data reading operation for a conventional multi-level memory device such as the mask ROM device 1 of FIG. 3. Referring to FIG. 3, the multilevel mask ROM memory device 1 comprises a memory cell array 10 including a plurality of nonvolatile memory cells respectively arranged at intersections of word lines and bit lines (not shown). Each of the nonvolatile memory cells is operative to store multi-bit data, i.e., can support a plurality of threshold voltages. For example, to store two bits, each nonvolatile memory cell may take on one of the four threshold voltages Vth1, Vth2, Vth3,Vth4 illustrated in FIG. 1. One of the word lines is selected by a row decoder circuit 20, and at least one bit line is selected by a column decoder circuit 40. The selected word line is sequentially driven at different word line voltages $V_{WLi}$ (e.g., i=1, 2, 3) supplied by a word line voltage generating circuit 30. The word line voltage generating circuit 30 sequentially generates the different word line voltages $V_{WLi}$ in response to sensing period signals STGi from a sensing period signal generating circuit 50. As illustrated in FIG. 2, the word line voltages may be varied from lower levels to higher levels during a read cycle, but those skilled in the art will appreciate that the voltages may be varied in other way, e.g., from higher levels to lower levels. An example of a word line voltage generating circuit is described in U.S. Pat. No. 5,457,650 to Sugiura et al.

The sensing period signal generating circuit 50 generates sensing period signals STGi and a sensing enable signal SAen. The signals STGi define sensing periods t1, t2, t3, respectively, and the sensing enable signal SAen is a pulse asserted at predetermined sensing points within the sensing periods. Data stored in a nonvolatile memory cell selected by the row and column decoder circuits 20, 40 is sensed, amplified, and latched by a sense amplifier and data latch circuit 60 that is responsive to the sensing period signals STGi and the sensing enable signal SAen. The data latched in the sense amplifier and data latch circuit 60 is output via a data output circuit 70.

FIG. 4 illustrates a sensing period signal generating circuit 50 according to the prior art. The circuit 50 includes a ring oscillator 51, a plurality of serially connected counters 52–54, first, second and third sensing period signal generators 55, 56, 57, and a sensing enable signal generator 58. The ring oscillator 51 generates a clock signal CLK in response to an oscillator enable signal OSCen. The counters 52–54 produce clock signals Pi (i=1, 2, ..., n), wherein the clock signal produced by a respective one of the counters 52–54 has a period twice that of the clock signal input thereto. The counters 52–54 are reset (initialized) by a reset signal RST. The first, second and third sensing period signal generators 55, 56, 57 generate first, second and third sensing period signals STG1, STG2, STG3, respectively, in response to the clock signals P1–Pm from the counters 52–54, synchronized with the clock signal CLK. The sensing periods t1, t2, t3 defined by the sensing period signals STG1, STG2, STG3 typically have the same duration. The sensing enable signal generator 58 also generates the sensing enable signal SAen responsive to the clock signals P1–Pm.

FIG. 5 is a timing diagram illustrating a conventional data reading operation for a multi-level memory device such as the nonvolatile semiconductor memory device 1 of FIG. 3. Before reading a two-bit cell, the reset signal RST is taken to a "high" level, resetting the counters 52–54 in the sensing period signal generating circuit 50. A memory cell is selected by the row and column decoder circuits 20, 40 according to row and column address signals, and a word line connected to the selected (addressed) memory cell is driven with a first word line voltage $V_{WL1}$ from the word line voltage generating circuit 30 during a first sensing period t1. A sense amplifier in the sensing amplifier and data latch circuit 60 detects whether a current flows through the selected memory cell when the sensing enable signal SAen is asserted, and data on a data line $DL_j$ is sensed and latched in the circuit 60. If the applied word line voltage turns the selected memory cell "ON", the output on the data line $DL_j$ takes on a "high" level. If the cell remains "OFF", the output on the data line $DL_j$ takes on a "low" level.

A second word line voltage $V_{WL2}$ higher than the first word line voltage $V_{WL1}$ is next applied to the selected word line during a second sensing period t2. A sense amplifier detects whether current flows through the selected memory cell when the sensing enable signal SAen is asserted. As in the first sensing period t1, data thus sensed is temporarily stored in the circuit 60. Similarly, a third word line voltage $V_{WL3}$ higher than the first and second word line voltages $V_{WL1}$, $V_{WL2}$ is applied to the word line during a third sensing period t3, and a sense amplifier detects whether current flows through the selected memory cell when the sensing enable signal SAen is asserted. Data thus sensed is latched in the circuit 60.

The above-described conventional multi-level memory device may have potential disadvantages. If the gate-source voltage $V_{gs}$ applied to the selected memory cell in each of the sensing periods t1, t2, t3 is the same, the cell currents Icell00, Icell01, Icell10 generated for cells programmed at different logic states "00", "01" and "10" differ, as shown in FIG. 6. Consequently, the times needed for sufficient charge transfer to sense the respective data states of the differently programmed cells may differ. At one extreme, using a sensing time based on the "00" state may provide insufficient time for charge transfer to sense the "01" and "10" states, potentially leading to data sensing errors. At another extreme, however, use of a sensing time based on the "10" state may increase data access time and current consumption, leading to reduced reliability and shortened battery lifetime in low-power applications.

SUMMARY OF THE INVENTION

In light of the foregoing, it is an object of the present invention to provide memory devices and methods of operation thereof which offer increased data reading accuracy.

It is another object of the present invention to provide memory devices and methods of operation thereof which offer increased reliability and reduced power consumption.

These and other objects, features and advantages are provided, according to the present invention, by memory devices and memory operation methods in which a word line voltage generator applies a word line voltage to a memory cell and a dummy memory cell during a sensing period that has a duration controlled based on current generated in the dummy memory cell. In a multi-level device, respective sensing periods are determined based on cell currents produced in respective dummy memory cells having threshold voltages set to values that bracket possible programmed threshold voltages for the cells. The duration of the sensing periods may thus be tailored to the operational characteristics of cells, reducing the likelihood of data reading errors without requiring unnecessarily long sensing periods.

In particular, according to the present invention, an apparatus for controlling reading of memory cells in a memory device comprises a word line voltage generator operative to apply a word line voltage to a selected memory cell of memory device responsive to a sensing period signal. A dummy memory cell is coupled to the word line voltage generator such that the word line voltage is applied to the dummy memory cell, the dummy memory cell having a threshold voltage. A sensing period controller is coupled to the dummy memory cell and operative to produce the sensing period signal responsive to a current generated in the dummy memory cell.

According to an embodiment of the present invention, the sensing period controller includes a dummy sense amplifier coupled to the dummy memory cell and operative to produce a dummy cell sense amplifier output signal responsive to a current in the dummy memory cell. A sensing time detector is coupled to the dummy sense amplifier and operative to produce sensing time signal in response to a transition of the dummy cell sense amplifier output signal. A sensing period signal generator is coupled to the sensing time detector and operative to generate the sensing period signal responsive to the sensing time signal.

The sensing time detector may comprise a latch coupled to the dummy sense amplifier and operative to receive the dummy cell sense amplifier output signal from the dummy sense amplifier and produce a corresponding latch output signal therefrom responsive to the sensing period signal. A pulse generator may be coupled to the latch and operative to produce the sensing time signal responsive to a transition in the latch output signal. A delay may be coupled between the latch and the pulse generator.

The sensing period signal generator may comprise a clock circuit operative to produce a clock signal and operative to reset the clock signal responsive to at least one of the sensing time signal and a reset signal. A sensing period signal generator may be coupled to the clock circuit and to the latch, the sensing period signal generator generating the sensing period signal responsive to the clock signal, to the latch output signal, and to the reset signal. The sensing period signal generator may be operative to reset the sensing period signal to a first state responsive to the reset signal, to set the sensing period signal to a second state responsive to the clock signal, and to reset the sensing period signal to the first state responsive to the latch output signal.

According to another aspect of the present invention, an apparatus for reading memory cells in a multi-level memory device including a plurality of memory cells comprises a word line voltage generator operative to apply respective word line voltages to a selected memory cell of the plurality of memory cells responsive to respective sensing period signals, the word line voltage generator applying a first word line voltage responsive to a first sensing period signal and applying a second word line voltage responsive to a second sensing period signal. A plurality of dummy memory cells is coupled to the word line voltage generator such that the first and second word line voltages are applied to the plurality of dummy memory cells during the first and sensing periods, the plurality of dummy memory cells including a first dummy memory cell having a first threshold voltage outside of a range from the first word line voltage to the second word line voltage and a second dummy memory cell having a second threshold voltage within the range from the first word line voltage to the second word line voltage. A sensing period controller is coupled to the plurality of dummy memory cells and operative to produce the first and the second sensing period signals responsive to currents generated in the first and second dummy memory cells.

The sensing period controller may include a dummy cell sense amplifier circuit coupled to the first dummy memory cell and to the second dummy memory cell, the dummy cell sense amplifier circuit operative to produce a first dummy cell sense amplifier output signal and a second dummy cell sense amplifier output signal responsive to currents in respective ones of the first and second dummy memory cells. A sensing time detecting circuit may be coupled to the dummy cell sense amplifier circuit and operative to produce a first sensing time signal and a second sensing time signal, respectively, in response to a transition of respective ones of the first and second dummy cell sense amplifier output signals. A sensing period signal generating circuit may be coupled to the sensing time detecting circuit and operative to generate the first and second sensing period signals responsive to respective ones of the first and second sensing time signals.

According to method aspects of the present invention, a memory device including a plurality of memory cells is read by applying a word line voltage to a selected memory cell and to a dummy memory cell for a sensing period having a duration dependent on a current produced in the dummy memory cell. In a multi-level memory device, a sequence of word line voltages to a selected memory cell and to a plurality of dummy memory cells having respective threshold voltages for a series of sensing periods having respective durations that are dependent on respective currents produced in respective dummy memory cells by the respective word line voltages. The sequence of word line voltages may comprise a first word line voltage and a second word line voltage, and the plurality of dummy memory cells include a first dummy memory cell having a first threshold voltage outside of the range from the first word line voltage to the second word line voltage and a second dummy memory cell having a second threshold voltage within the range from the first word line voltage to the second word line voltage. Improved memory device operation may thereby be provided.

BRIEF DESCRIPTION OF THE DRAWINGS

FIG. 4 is a schematic diagram illustrating a sensing period signal generating circuit of FIG. 3 according to the prior art.

DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices.

Figure 3:
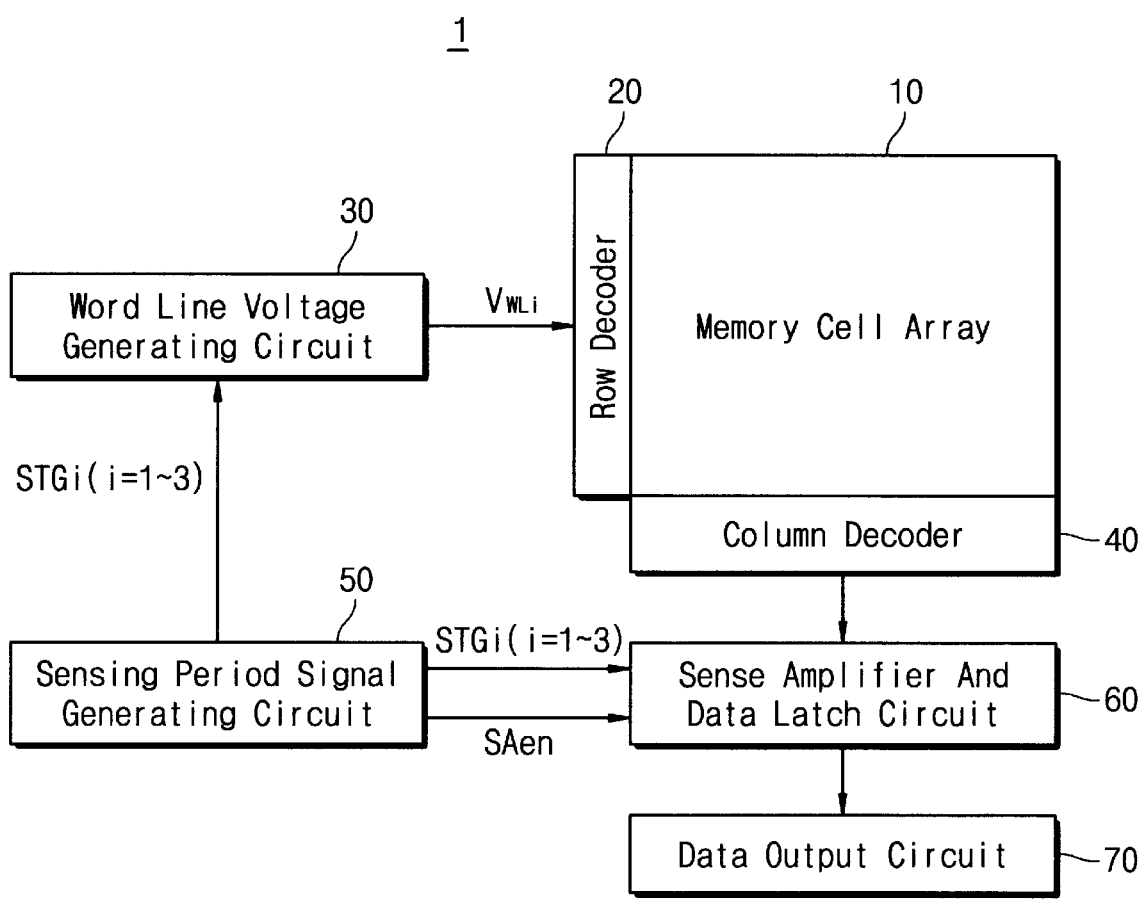
FIG. 3 is a schematic diagram illustrating a multi-level memory device according to the prior art.
Figure 5:
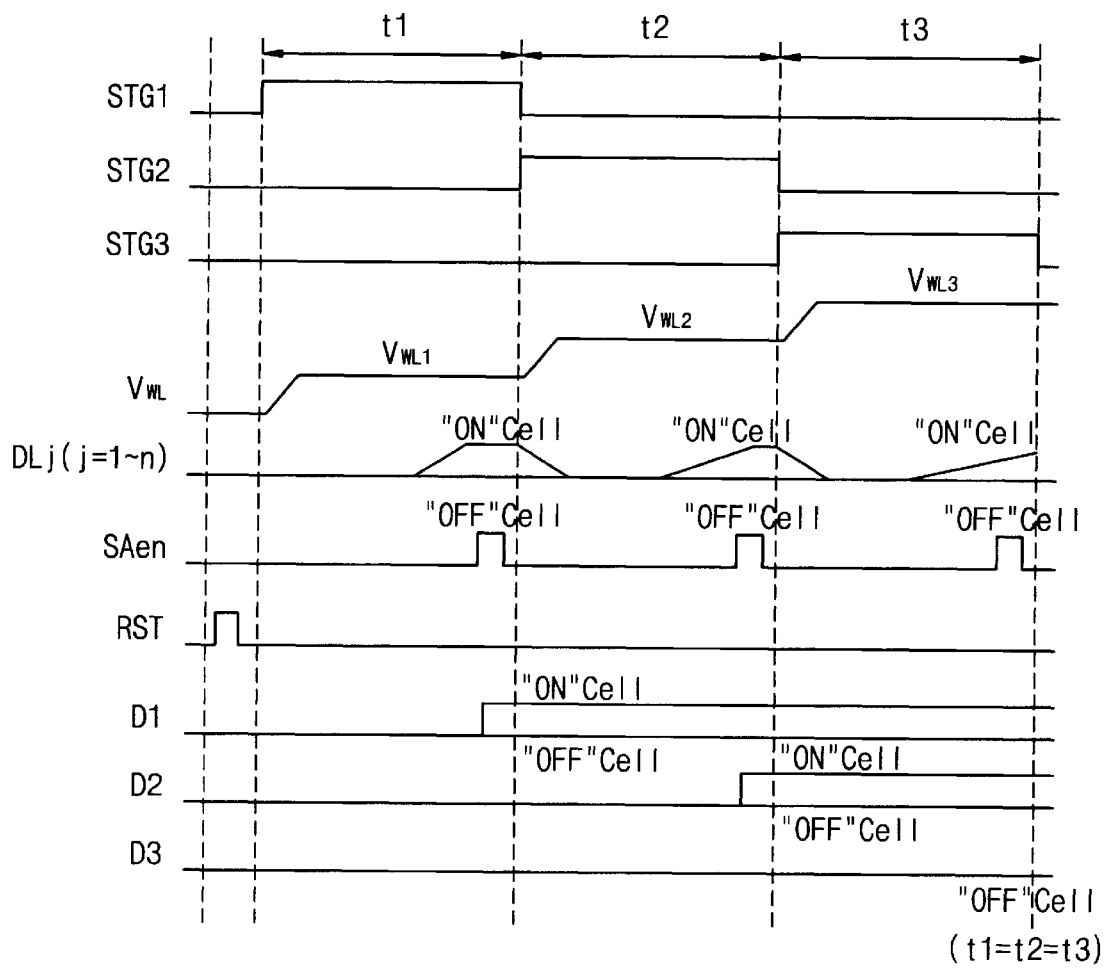
FIG. 5 is a timing diagram illustrating a data reading operation for a multi-level memory device according to the prior art.
Figure 6:
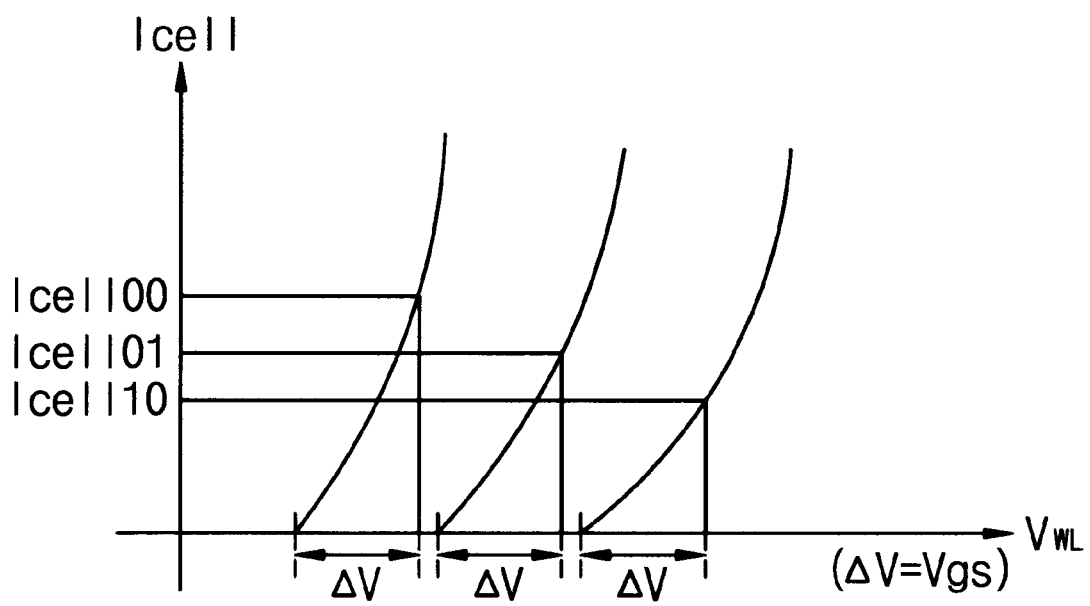
FIG. 6 is a diagram illustrating cell currents for different data states of a memory cell.
Figure 7:
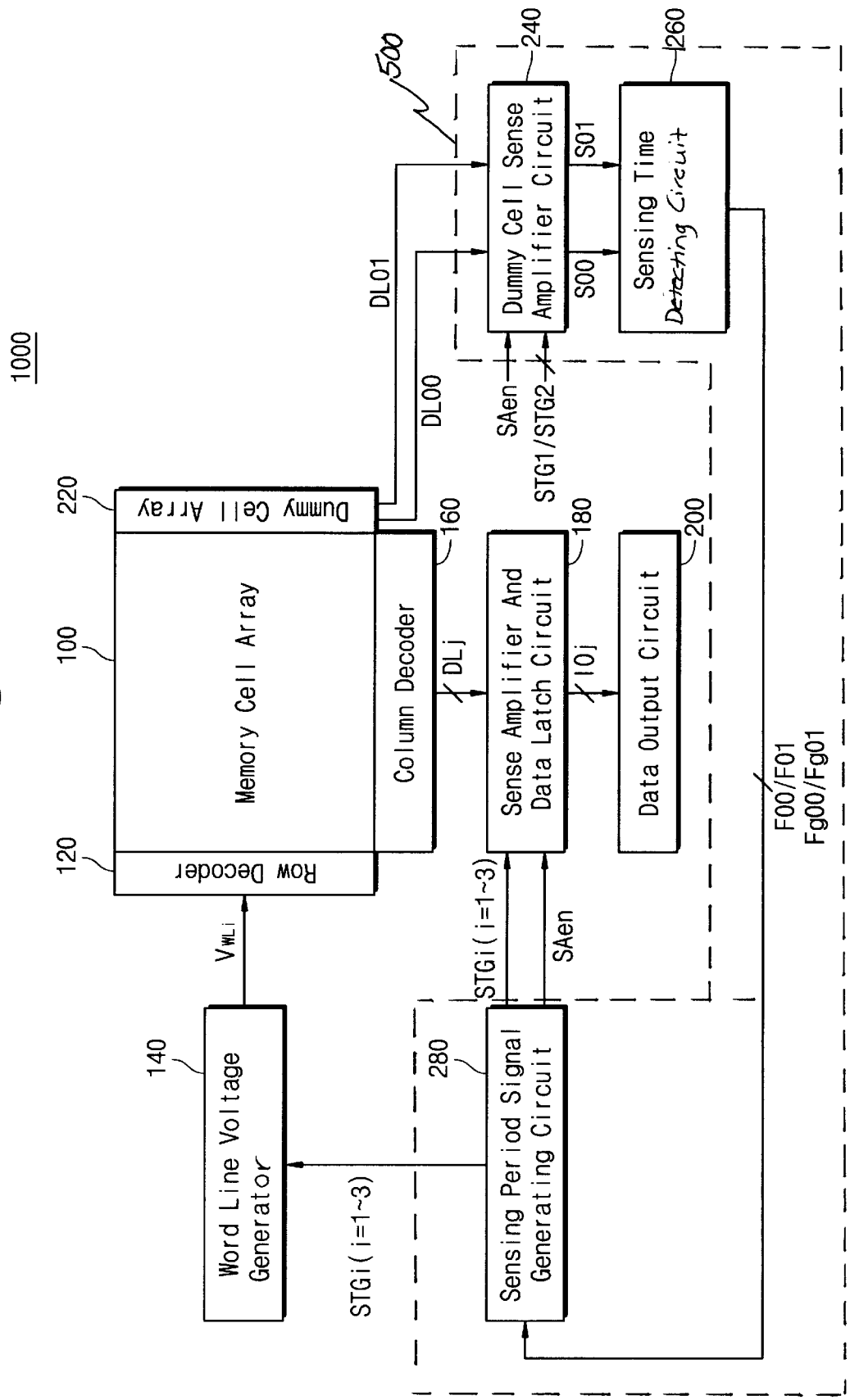
FIG. 7 is a schematic diagram illustrating a multi-level memory device according to an embodiment of the present invention.

FIG. 7 is a block diagram of a multi-level memory device 1000 according to an embodiment of the present invention. The memory device 1000 includes a memory cell array 100, a row decoder circuit 120, a word line voltage generator 140, a column decoder circuit 160, a sense amplifier and data latch circuit 180, and a data output circuit 200. These components generally operate in the manner described with reference to FIG. 3, and thus further detailed description need not be provided.

As illustrated in FIG. 7, the memory device 1000 further comprises a dummy cell array 220 and a sensing period controller 500 that includes a dummy cell sense amplifier circuit 240, a sensing time detecting circuit 260 and a sensing period signal generating circuit 280. The sensing period controller 500 varies sensing period signals STGi applied to the word line voltage generator 140 based on currents generated in dummy memory cells of the dummy memory cell array 220.

Figure 1:
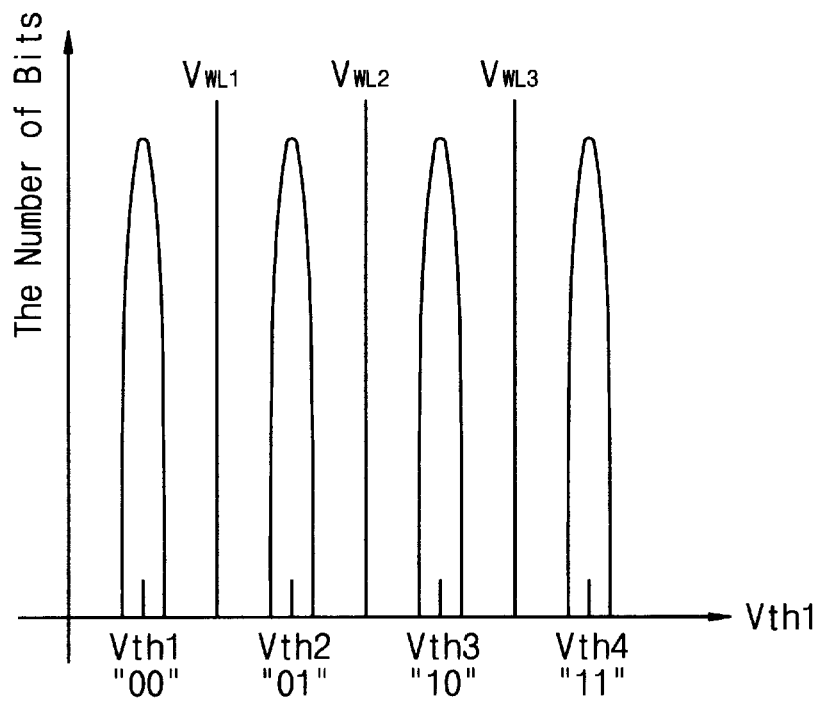
FIG. 1 illustrates threshold voltage distributions in accordance with data states of a conventional multi-level memory cell.
Figure 2:
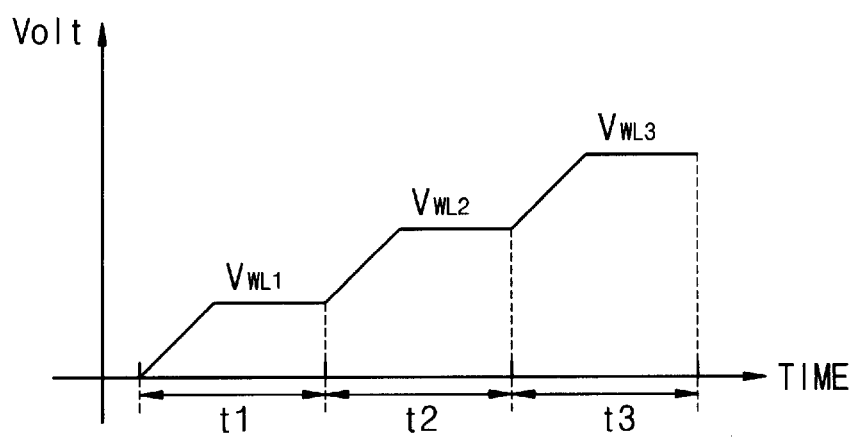
FIG. 2 illustrates word line voltages applied to a word line during a conventional data reading operation.

Assuming that the memory cells of the memory cell array 100 are used to store two bits of data, the dummy memory cell array 220 includes at least two dummy memory cells. If the word line voltage generator 140 produces word line voltages $V_{WLi}$ (i=1, 2 and 3) as a sequence of increasing voltages, i.e., from lower to higher voltage levels as illustrated in FIG. 2, the two dummy memory cells have respective first and second threshold voltages Vth1, Vth2 corresponding to the "00" and the "01" states of FIG. 1, respectively. In other words, the first dummy cell threshold voltage is set to a level Vth1 less than the first word line voltage $V_{WL1}$, and the second dummy cell threshold voltage is set to a level Vth2 that is greater than the first word line voltage $V_{WL1}$, and less than the second word line voltage $V_{WL2}$. If the word line voltages $V_{WLi}$ are decreased from higher to lower levels, however, the two dummy cells are set at threshold voltages Vth4, Vth3 corresponding to the "10" and "11" states of FIG. 1, i.e., to a first threshold voltage greater than the third word line voltage $V_{WL3}$ and a second threshold voltage between the second word line voltage $V_{WL2}$, and the third word line voltage $V_{WL3}$. For purposes of the following discussion, it will be assumed that the word line voltages $V_{WLi}$ are applied in an increasing fashion as illustrated in FIG. 2.

The dummy memory cells of the dummy memory cell array 220 are commonly connected to the word line voltage generator 140 when a selected memory cell of the memory cell array 100 is being driven, such that word line voltage applied to the selected memory cell is also applied to the first and second dummy memory cells. The dummy cell sense amplifier circuit 240 senses and amplifies data (that is, "00" and "01") respectively stored in the two dummy memory cells responsive to sensing period signals STG1, STG2 and sensing enable signal SAen from the sensing period signal generating circuit 280. The dummy cell sense amplifier circuit 240 senses data stored in one of the dummy memory cells (the cell having the first threshold voltage Vth1) in response to the first sensing period signal STG1 and the sensing enable signal SAen during a first sensing period t1, and senses data in the other dummy memory cell (the cell having the second threshold voltage Vth2) in response to the second sensing period signals STG2 and the sensing enable signal SAen during a second sensing period t2. The dummy cell sense amplifier circuit 240 may include respective first and second sense amplifiers connected through corresponding lines DL00 and DL01 to respective ones of the first and second dummy memory cells.

The sensing time detecting circuit 260 generates sensing time signals F00, F01, Fg00, Fg01 in response to output signals S00, S01 from the dummy cell sense amplifier circuit 240. The sensing period signal generating circuit 280 generates the sensing period signals STGi (i=1, 2 and 3) and the sensing enable signal SAen in response to the sensing time control signals F00, F01, Fg00, Fg01. As illustrated, the sensing time signals F00, F01 are latch output signals (see FIG. 9 and accompanying description, below) corresponding to data stored in the dummy cells, while the sensing time signals Fg00, Fg01 are pulsed signals used to indicate completion of data sensing operations for each dummy cell.

Figure 8:
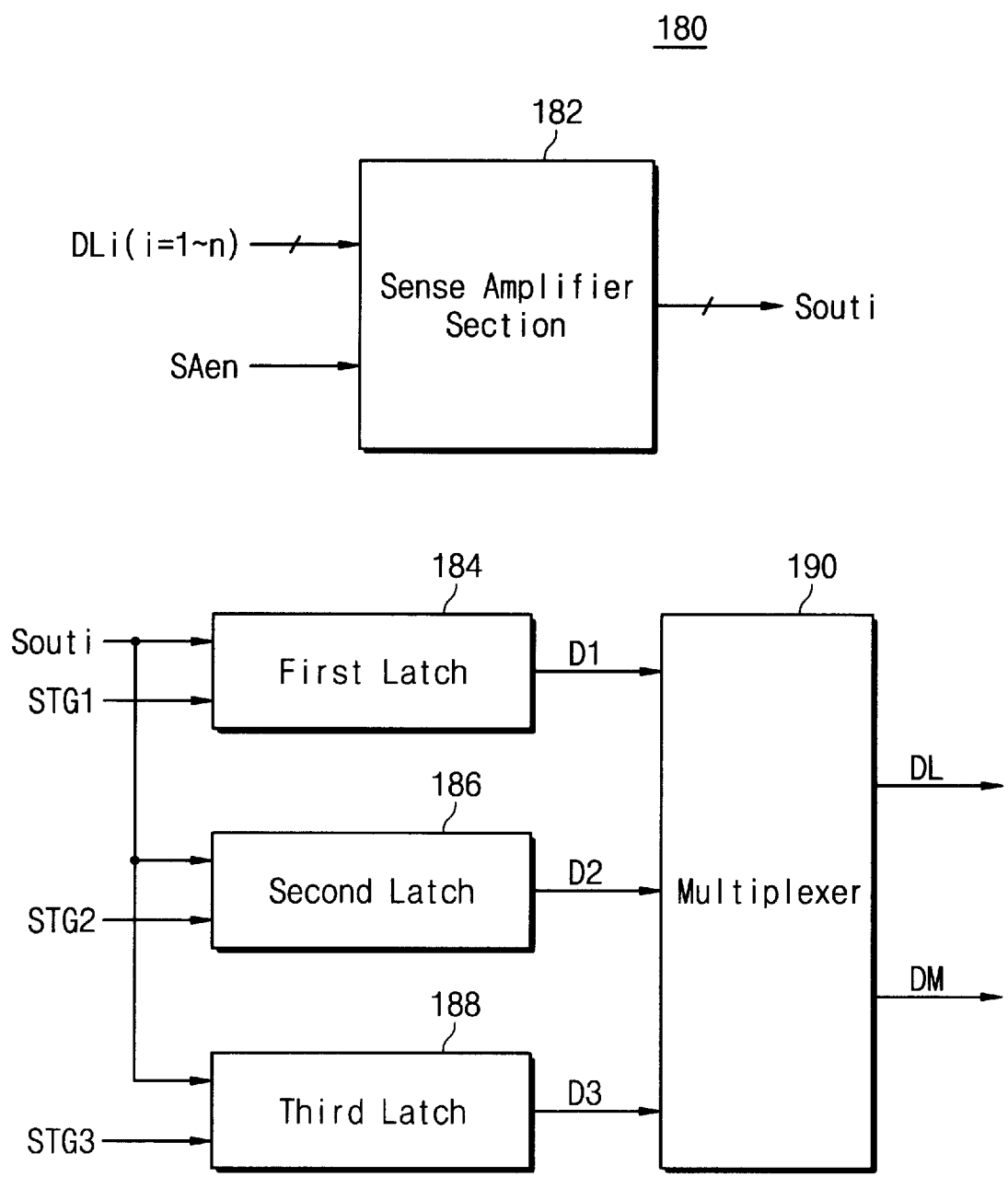
FIG. 8 is a schematic diagram illustrating a sense amplifier and data latch circuit according to an embodiment of the present invention.

FIG. 8 illustrates an exemplary sense amplifier and data latch circuit 180. The sense amplifier and data latch circuit 180 comprises a sense amplifier section 182, including a plurality of sense amplifiers (not shown) that sense signals on data lines DLi (i=1–n). The sense amplifiers sense and amplify data respectively stored in corresponding memory cells in response to the sensing enable signal SAen from the sensing period signal generating circuit 280. Each of the sense amplifiers outputs a "high" level when a memory cell connected thereto is in a conducting "ON" state, and outputs a "low" level when a memory cell connected thereto is in a non-conducting "OFF" state. An example of such a sense amplifier is described in U.S. Pat. No. 5,761,132 to Kim, assigned to the assignee of the present invention and incorporated herein by reference in its entirety. First, second and third latches (data storing circuits or registers) 184, 186, 188 receive the sense amplifier output signal Souti, producing signals D1, D2, D3 that are combined by a multiplexer 190. The latches 184, 186, 188 are enabled by respective ones of the sensing period signals STG1, STG2, STG3. The multiplexer 190 mixes outputs D1, D2, D3 and produces a two-bit data output DL, DM.

Figure 9:
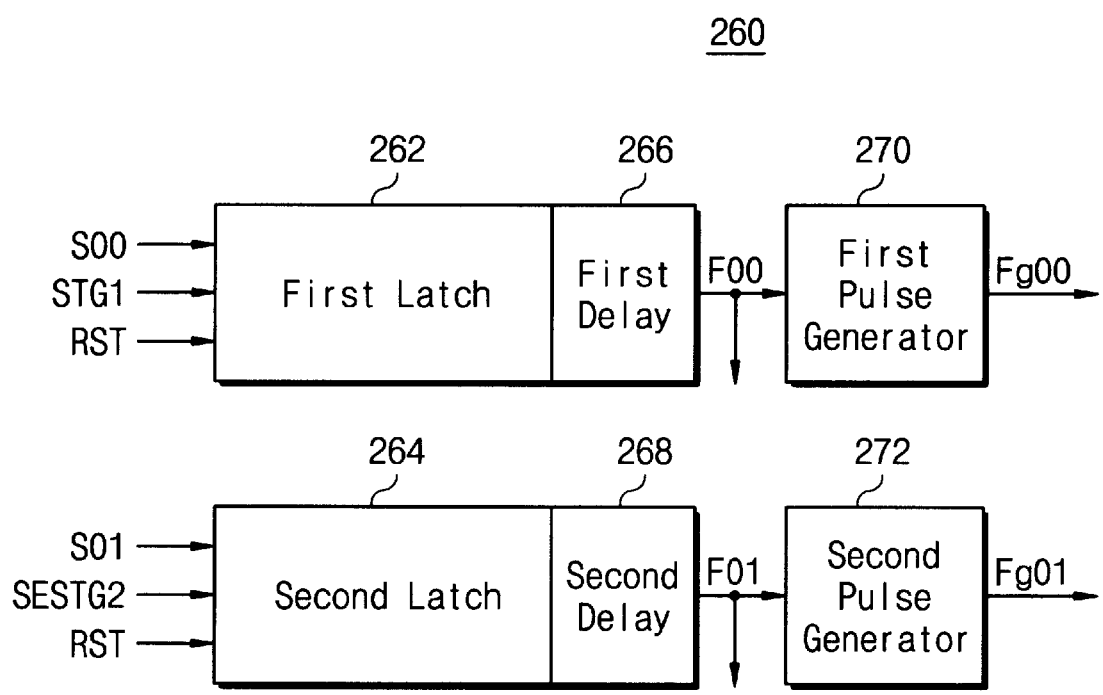
FIG. 9 is a schematic diagram of a sensing time detector according to an embodiment of the present invention.

FIG. 9 is a block diagram of the sensing time detecting circuit 260 according to a preferred embodiment of the present invention. As illustrated in FIG. 9, the sensing time detecting circuit 260 comprises first and second latches 262, 264, first and second delays 266, 268, and first and second pulse generators 270, 272. The first and second latches 262, 264 are initialized by a reset signal RST (a pulse), which is asserted before data sensing operations begin. The first latch 262 receives a first dummy cell sense amplifier output signal S00 from the dummy cell sense amplifier circuit 240 in response to the first sensing period signal STG1. The second latch 264 receives the second dummy sense amplifier output signal S01 from the dummy cell sense amplifier circuit 240 in response to the second sensing period signal STG2. The first and second pulse generators 270, 272 generate the sensing time control signals Fg00, Fg01 in response to the sensing time signals F00, F01 produced by the first and second latches 262, 264. The sensing time signal Fg00 is a pulse signal that indicates that a data sensing operation for the first dummy memory cell (the cell having a threshold voltage Vth1) has been completed. The sensing time signal Fg01 indicates that a data sensing operation for the second dummy cell (the cell having a threshold voltage Vth2) has been completed.

As illustrated, first and second delays 266, 268 are provided, and can be used to introduce selective delays in the latch output signals F00, F01. For example, the delays 266, 268 can be used to compensate for variations of characteristics of manufactured cells with respect to nominal design characteristics. It will be appreciated that the delays introduced by the delays 266, 268 can be determined according to the degree of the threshold voltage distribution.

Figure 10:
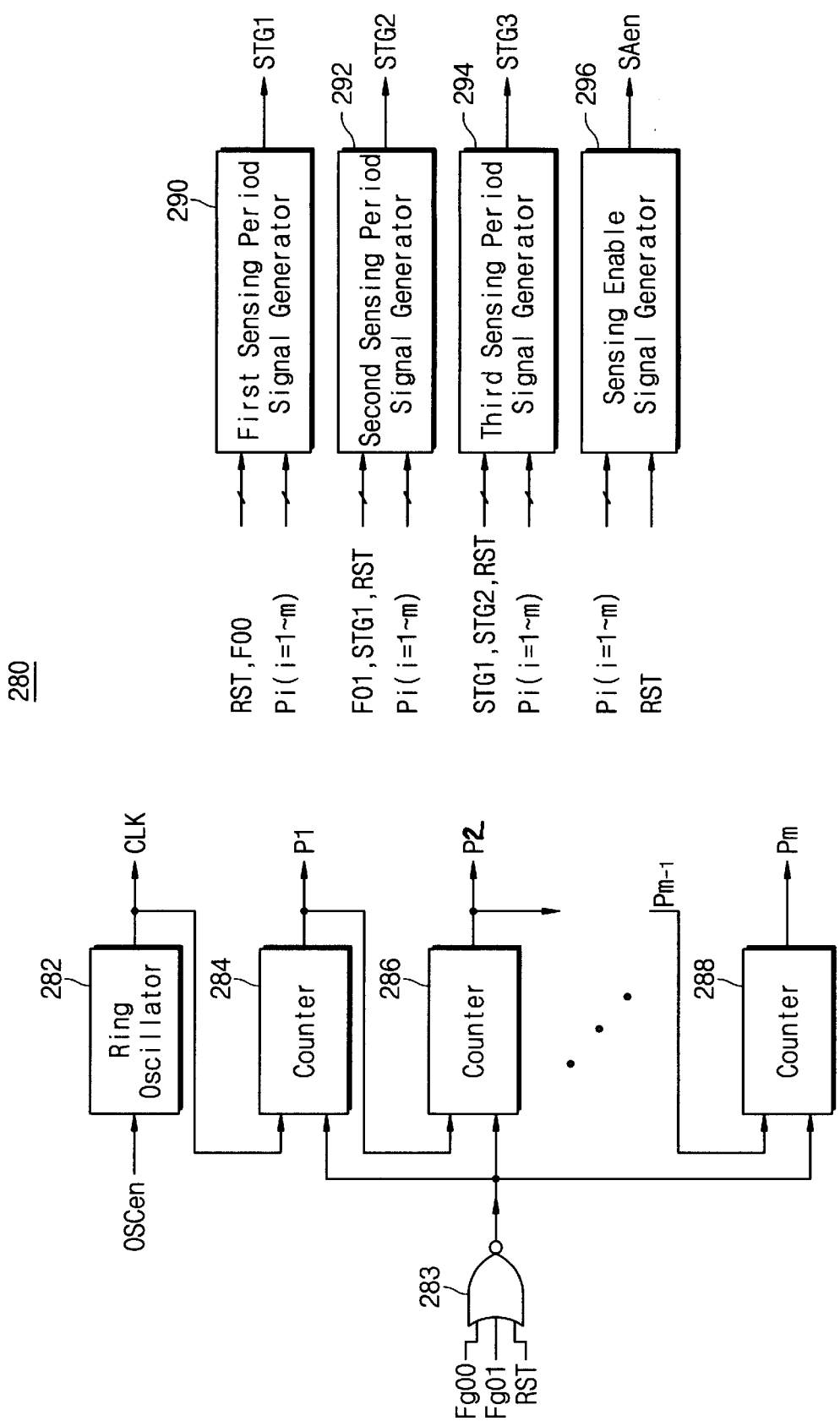
FIG. 10 is a schematic diagram of a sensing period signal generator according to an embodiment of the present invention.

A sensing period signal generating circuit 280 according to a preferred embodiment of the present invention is illustrated in FIG. 10. Referring to FIG. 10, the sensing period signal generating circuit 280 comprises an oscillator 282, a NOR gate 283, a plurality of clock dividers (e.g., counters) 284–288, first, second and third sensing period signal generators 290, 292, 294 and a sensing enable signal generator 296. The oscillator 282 may comprise a ring oscillator, the operation of which is well known to those skilled in the art. The oscillator 282 generates a clock signal CLK in response to an oscillator enable signal OSCen. Each of the clock dividers 284–288 generates a clock signal Pi (i=1–m) having a period twice that of the clock signal input thereto from a previous clock divider stage; for example, the first clock divider 284 generates an output clock signal P1 from master clock signal CLK. The clock dividers 284–288 are reset (initialized) responsive to the reset signal RST and the sensing time signals Fg00, Fg01 applied to the NOR gate 283, i.e., when any of the reset signal RST or the sensing time signals Fg00, Fg01 goes to a logic "high" state, the clock dividers 284–288 are reset.

The first sensing period signal generator 290 generates the first sensing period signal STG1 responsive to the reset signal RST, the clock signals Pi from the clock dividers 284–288, and the first sensing time signal F00. The second period signal generator 292 generates a second sensing period signal STG2 responsive to the reset signal RST, divided clock signals Pi, the first sensing period signal STG1, and the sensing time signal F01. The third sensing period signal generator 294 generates the third sensing period signal STG3 responsive to the reset signal RST, the clock signals Pi, and the first and second sensing period signals STG1, STG2. The sensing enable signal generator 296 generates a sensing enable signal SAen (a pulsed signal) responsive to the clock signals Pi and the reset signal RST.

Figure 11:
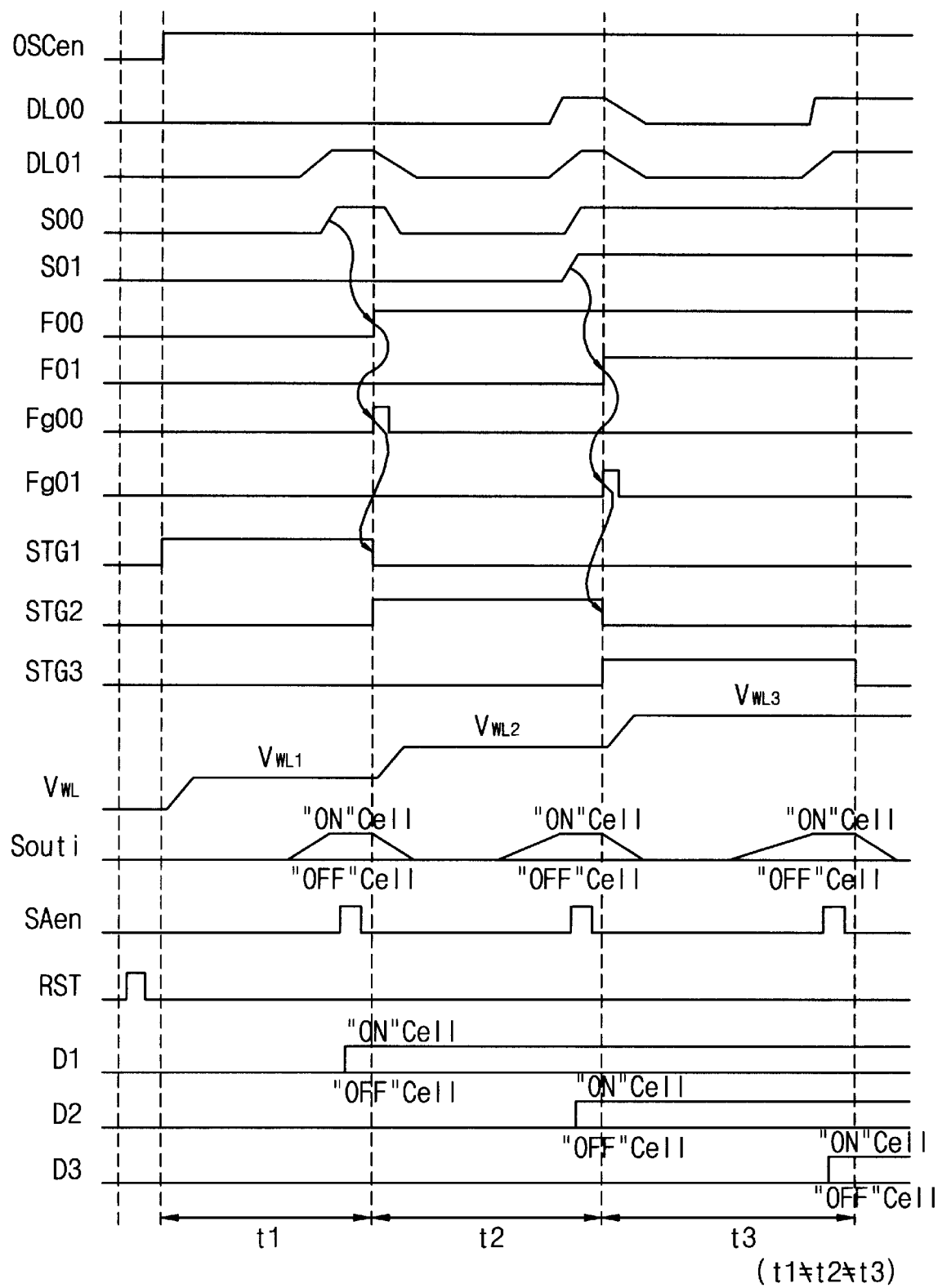
FIG. 11 is a timing diagram illustrating data reading operations according to an aspect of the present invention.

Detailed description of exemplary operations of the apparatus of FIGS. 7–10 will now provided with reference to the timing diagram of FIG. 11. Assume that each memory cell stores two bits of data, e.g., "00", "01", "10" and "11," and that two dummy memory cells are provided in dummy memory cell array 220 having threshold voltages Vth1 and Vth2, respectively, as defined in FIG. 1. Before data sensing begins during a first sensing period t1, the reset signal RST is taken to a "high" level, initializing the sensing time detecting circuit 260 and the sensing period signal generating circuit 280. Specifically, assertion of the reset signal RST resets the first and second latches 262, 264 of the sensing time detecting circuit 260 and the clock dividers 284–288, the first, second and third sensing period signal generators 290, 292, 294 and the sensing enable signal generator 296 of the sensing period signal generating circuit 280.

During the first sensing period t1, the oscillator enable signal OSCen goes to a "high" level. The ring oscillator 282 generates the master clock signal CLK in response to assertion of the oscillator enable signal OSCen, and the clock dividers 284–288 produce the divided clock signals Pi. Responsive to the divided the clock signals Pi, the first sensing period signal STG1 is taken to a "high" level. In response thereto, the word line voltage generator 140 generates the first word line voltage $V_{WL1}$. The first word line voltage $V_{WL1}$ is supplied through the row decoder circuit 120 into a word line connected to a selected memory cell of the memory cell array 100, and is also supplied to the two dummy memory cells of the dummy cell array 220.

A bit line connected to the selected memory cell of the memory cell array 100 is selected by the column decoder circuit 160 for connection to the sense amplifier section 182. Similarly, data lines (bit lines) DL00, DL01 coupled to the two dummy memory cells are coupled to the dummy cell sense amplifier circuit 240. After passage of a predetermined time, the sensing enable signal generator 296 in the sensing period signal generating circuit 280 generates the sensing enable signal SAen (a pulse as shown in FIG. 11). The sense amplifier section 182 responds to the sensing enable signal SAen, determining whether a current flow through the selected memory cell. If the selected memory cell is the "OFF" cell, the output Souti of the sense amplifier section 182 associated with the selected memory cell becomes the 'L' level, and if it is the "ON" cell, the output Souti thereof becomes the 'H' level.

Since the dummy cell connected to the first data line DL00 has a threshold voltage Vth1 less than the first word line voltage $V_{WL1}$ and the dummy cell connected to the second data line DL01 has a threshold voltage Vth2 higher than the first word line voltage $V_{WL1}$, the first data line DL00 takes on a logic "low" level and the second data line DL01 takes on a logic "high" level. Consequently, the first and second dummy cell sense amplifier output signals S00, S01 from the dummy cell sense amplifier circuit 240 take on "high" and "low" levels, respectively. In response, the first latch 262 of the sensing time detecting circuit 260, enabled by the first sensing period signal STG1, transitions the sensing time signal F00 to the logic "high" level, subject to the delay introduced by the first delay 266, indicating that the sensing period t1 defined by the first dummy cell (the dummy cell having the threshold voltage Vth1) is complete.

In response, the first pulse generator 270 generates the sensing time signal Fg00 in the form of a pulse that causes the clock dividers 284–288 of the sensing period signal generating circuit 280 to reset and taking the first sensing period signal STG1 to a logic "low" level and taking the second sensing period signal STG2 to a logic "high level" to start a second sensing period t2. The first sensing period signal STG1 is maintained at the "low" (inactive) due to the "high" level of the sensing time signal F00. Data Souti is read from the selected memory cell is temporarily stored in first latch 184 of the data latch circuit 180. If the threshold voltage of the selected memory cell is higher than the first word line voltage $V_{WL1}$, data Souti has a "low" level, while if the threshold voltage of the selected memory cell is less than the first word line voltage $V_{WL1}$, data Souti has a "high" level. The duration of the first sensing period t1 is automatically controlled based on current flowing in the first dummy memory cell, i.e., the dummy memory cell having a predetermined threshold voltage of Vth1. Thus, if the selected memory cell has been programmed to a threshold voltage of Vth1 (corresponding to "00" data stored), the sensing period t1 extends for a time sufficient to ensure that an accurate reading is performed.

The second sensing period signal STG2 is similarly controlled. The word line voltage generator 140 generates the second word line voltage $V_{WL2}$ in response to the second sensing period signal STG2 going to the logic "high" level. The second word line voltage $V_{WL2}$ is supplied through the row decoder circuit 120 into the selected word line, and is also supplied to the first and second dummy memory cells. The bit line connected to the selected memory cell is selected by the column decoder circuit 160, and coupled to the sense amplifier section 182. Similarly, data lines DL00, DL01 respectively coupled to the first and second dummy cells are coupled to the dummy cell sense amplifier circuit 240. After a lapse of a predetermined time, the sensing enable signal generator 296 generates the sensing enable signal SAen, causing the sense amplifier section 182 to detect current flow through the selected memory cell.

As the two dummy memory cells in the dummy cell array 220 have threshold voltages Vth1 and Vth2 that are less than the second word line voltage $V_{WL2}$, both of the data lines DL00, DL01 go to a logic "low" level, and the dummy cell sense amplifier output signals S00, S01 both go to a logic "high" level. In response, the sensing time signal F01 is latched at a logic "high" level by the second latch 264. The second pulse generator 272 responsively produces the sensing time control signal Fg01 in the form of a pulse, resetting the clock dividers 284–288 and causing the second sensing period signal STG2 to go to a logic "low" level and the third sensing period signal STG3 to go to a logic "high." The second sensing period t2 thus terminates, with data Souti read from the selected memory cell stored in the second latch 186 of the data latch circuit 180.

Similar to the first sensing period t1, the duration of the second sensing period t2 is automatically controlled based on current flowing in the second dummy memory cell, i.e., the dummy memory cell having a predetermined threshold voltage of Vth2. Thus, if the selected memory cell has been programmed to a threshold voltage of Vth2 (corresponding to "01" data stored), the sensing period t2 extends for a time sufficient to ensure that an accurate reading is performed.

In response to assertion of the third sensing period signal STG3, the word line voltage generating circuit 140 generates the third word line voltage $V_{WL3}$. The third word line voltage $V_{WL3}$ is supplied through the row decoder circuit 120 into the selected word line, and is also supplied to the two dummy cells. The selected memory cell of the memory cell array 100 is coupled to the sense amplifier section 182, and the data lines DL00, DL01 are respectively coupled to first and second dummy cell sense amplifiers in the dummy cell sense amplifier circuit 240. After a predetermined interval, the sensing enable signal generator 296 in the sensing period signal generating circuit 280 asserts the sensing enable signal SAen, with the sense amplifier section 182 responsively detecting current flow through the selected memory cell. The third sensing operation for the selected memory cell is then complete, and data Souti read from the selected memory cell is stored in the third latch 188 of the data latch circuit 180. Data D1, D2, D3 from the first, second and third latches 184, 186, 188 are provided to the multiplexer 190, which combines them to produce the two-bit data output DL, DM. Unlike the first and second sensing periods t1, t2, the duration of the third sensing period t3 is not controlled by sensing current in a dummy memory cell.

According to the above illustrated embodiments of the present invention, data sensing periods are automatically controlled by sensing currents flowing in dummy memory cells that have threshold voltages with predetermined relationships to the word line voltages applied during the data sensing operations. In this manner, sensing period duration can be optimized while maintaining sufficient sensing margin, providing potential reductions in current consumption and operation speed in comparison to conventional devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An apparatus for controlling reading of memory cells in a memory device, the apparatus comprising:

a word line voltage generator operative to apply a word line voltage to a selected memory cell of the memory device responsive to a sensing period signal;

a dummy memory cell coupled to said word line voltage generator such that said word line voltage is applied to said dummy memory cell, said dummy memory cell having a threshold voltage; and a sensing period controller coupled to said dummy memory cell and operative to produce said sensing period signal responsive to a current generated in said dummy memory cell.

2. An apparatus according to claim 1, wherein said sensing period controller comprises:

a dummy sense amplifier coupled to said dummy memory cell and operative to produce a dummy cell sense amplifier output signal responsive to said current in said dummy memory cell;

a sensing time detector coupled to said dummy sense amplifier and operative to produce a sensing time signal in response to a transition of said dummy cell sense amplifier output signal; and a sensing period signal generator coupled to said sensing time detector and operative to generate said sensing period signal responsive to said sensing time signal.

3. An apparatus according to claim 2, wherein said sensing time detector comprises:
- a latch coupled to said dummy sense amplifier and operative to receive said dummy cell sense amplifier output signal from said dummy sense amplifier and produce a corresponding latch output signal therefrom responsive to said sensing period signal; and
- a pulse generator coupled to said latch and operative to produce said sensing time signal responsive to a transition in said latch output signal.

4. An apparatus according to claim 3, wherein said sensing time detector further comprises a delay coupled between said latch and said pulse generator.

5. An apparatus according to claim 4, wherein said delay is operative to provide an adjustable delay.

6. An apparatus according to claim 3, wherein said sensing period signal generator comprises a clock circuit operative to produce a clock signal and operative to reset said clock signal responsive to at least one of said sensing time signal and a reset signal, and wherein said sensing period signal generator is coupled to said clock circuit and to said latch and is operative to generate said sensing period signal responsive to said clock signal, to said latch output signal, and to said reset signal.

7. An apparatus according to claim 6, wherein said sensing period signal generator is operative to reset said sensing period signal to a first state responsive to said reset signal, to set said sensing period signal to a second state responsive to said clock signal, and to reset said sensing period signal to said first state responsive to said latch output signal.

8. An apparatus according to claim 6, wherein said dummy cell sense amplifier is operative to sense said current in said dummy memory cell responsive to a sensing enable signal, and further comprising a sensing enable signal generator operative to generate said sensing enable signal responsive to said reset signal and to said clock signal.

9. An apparatus for reading memory cells in a multi-level memory device including a plurality of memory cells, the apparatus comprising:
- a word line voltage generator operative to apply respective word line voltages to a selected memory cell of the plurality of memory cells responsive to respective sensing period signals, said word line voltage generator applying a first word line voltage responsive to a first sensing period signal and applying a second word line voltage responsive to a second sensing period signal;
- a plurality of dummy memory cells coupled to said word line voltage generator such that said first and second word line voltages are applied to said plurality of dummy memory cells during said first and second sensing periods, said plurality of dummy memory cells including a first dummy memory cell having a first threshold voltage outside of a range from said first word line voltage to said second word line voltage and a second dummy memory cell having a second threshold voltage within the range from said first word line voltage to said second word line voltage; and
- a sensing period controller coupled to said plurality of dummy memory cells and operative to produce said first and said second sensing period signals responsive to currents generated in said first and second dummy memory cells.

10. An apparatus according to claim 9, wherein said sensing period controller comprises:
- a dummy cell sense amplifier circuit coupled to said first dummy memory cell and to said second dummy memory cell, said dummy cell sense amplifier circuit operative to produce a first dummy cell sense amplifier output signal and a second dummy cell sense amplifier output signal responsive to currents in respective ones of said first and second dummy memory cells;
- a sensing time detecting circuit coupled to said dummy cell sense amplifier circuit and operative to produce a first sensing time signal and a second sensing time signal, respectively, in response to a transition of respective ones of said first and second dummy cell sense amplifier output signals; and
- a sensing period signal generating circuit coupled to said sensing time detecting circuit and operative to generate said first and second sensing period signals responsive to respective ones of said first and second sensing time signals.

11. An apparatus according to claim 10, wherein said dummy cell sense amplifier circuit comprises:
- a first dummy cell sense amplifier coupled to said first dummy memory cell and operative to generate said first dummy cell sense amplifier output signal; and
- a second dummy cell sense amplifier connected to said second dummy memory cell and operative to generate said second dummy cell sense amplifier output signal.

12. An apparatus according to claim 10, wherein said sensing time detecting circuit comprises:
- a first latch coupled to said dummy cell sense amplifier circuit and operative to receive said first dummy cell sense amplifier output signal and produce a corresponding first latch output signal therefrom responsive to said first sensing period signal;
- a first pulse generator coupled to said first latch and operative to produce said first sensing time signal responsive to a transition in said first latch output signal;
- a second latch coupled to said dummy cell sense amplifier circuit and operative to receive said second dummy cell sense amplifier output signal and produce a corresponding second latch output signal therefrom responsive to said second sensing period signal; and
- a second pulse generator coupled to said second latch and operative to produce said second sensing time signal responsive to a transition in said second latch output signal.

13. An apparatus according to claim 12, wherein said sensing time detecting circuit further comprises:
- a first delay coupled between said first latch and said first pulse generator; and
- a second delay coupled between said second latch and said second pulse generator.

14. An apparatus according to claim 13, wherein said first delay and said second delay are operative to provide respective adjustable delays.

15. An apparatus according to claim 12, wherein said sensing period signal generating circuit comprises:
- an oscillator operative to produce a master clock signal responsive to an oscillator enable signal;
- a series of clock dividers coupled to said oscillator and operative to produce a plurality of divided clock signals from said master clock signal;
- a clock reset circuit coupled to said first and said second pulse generators and operative to reset said series of clock dividers responsive to said first and said second sensing time signals and to a reset signal;

a first sensing period signal generator coupled to said series of clock dividers and to said first latch, said first sensing period signal generator generating said first sensing period signal responsive to said plurality of divided clock signals, to said first latch output signal, and to said reset signal; and a second sensing period signal generator coupled to said series of clock dividers, to said second latch and to said first sensing period signal generator, said second sensing period signal generator generating said second sensing period signal responsive to said plurality of divided clock signals, to said second latch output signal, to said first sensing period signal, and to said reset signal.

16. An apparatus according to claim 15:

wherein said first sensing period signal generator operative to reset said first sensing period signal to a first state responsive to said reset signal, to set said first sensing period signal to a second state responsive to said plurality of divided clock signals, and to reset said first sensing period signal to said first state responsive to said first latch output signal; and wherein said second sensing period signal generator is operative to reset said second sensing period signal to said first state responsive to said reset signal, to set said second sensing period signal to said second state responsive to said plurality of divided clock signals and to said first sensing period signal, and to reset said second sensing period signal to said first state responsive to said second latch output signal.

17. An apparatus according to claim 16, wherein said word line voltage generator is operative to produce a third word line voltage responsive to a third sensing period signal, and wherein said sensing period signal generating circuit further comprises a third sensing period signal generator coupled to said series of clock dividers, to said first sensing period signal generator, and to said second sensing period signal generator, said third sensing period signal generator generating said third sensing period signal responsive to said plurality of divided clock signals, to said first sensing period signal, to said second sensing period signal and to said reset signal.

18. An apparatus according to claim 17, wherein said third sensing period signal generator is operative to reset said third sensing period signal to said first state responsive to said reset signal and to set said third sensing period signal to said second state responsive to said plurality of divided clock signals and to said first and second sensing period signals.

19. An apparatus according to claim 9:

wherein said first word line voltage is less than said second word line voltage; and wherein said first threshold voltage is less than said first word line voltage; and wherein said second threshold voltage is greater than said first word line voltage and less than said second word line voltage.

20. An apparatus according to claim 9:

wherein said first word line voltage is greater than said second word line voltage;

wherein said first threshold voltage is greater than said first word line voltage; and wherein said second threshold voltage is greater than said second word line voltage and less than said first word line voltage.

21. An apparatus according to claim 15, wherein said dummy cell sense amplifier circuit is operative to sense currents in said first and second dummy memory cells responsive to a sensing enable signal, and further comprising a sensing enable signal generator operative to generate said sensing enable signal responsive to said reset signal and to said plurality of divided clock signals.

22. A multi-level memory device, comprising:

a plurality of memory cells;

a word line voltage generator operative to generate respective word line voltages responsive to respective sensing period signals, said word line voltage generator generating a first word line voltage responsive to a first sensing period signal and generating a second word line voltage responsive to a second sensing period signal;

means for selectively coupling said word line voltage generator to a memory cell of said plurality of memory cells to apply word line voltages thereto;

a plurality of dummy memory cells coupled to said word line voltage generator such that said first and second word line voltages are applied to said plurality of dummy memory cells when they are applied to the selected memory cell, said plurality of dummy memory cells including a first dummy memory cell having a first threshold voltage outside of a range from said first word line voltage to said second word line voltage and a second dummy memory cell having a second threshold voltage within the range from said first word line voltage to said second word line voltage; and a sensing period controller coupled to said plurality of dummy memory cells and operative to produce said first and said second sensing period signals responsive to currents generated in said first and second dummy memory cells.

23. A device according to claim 22, further comprising:

a sense amplifier coupled to the selected memory cell; and a data latch coupled to said sense amplifier and operative to latch a data value produced by said sense amplifier responsive to said sensing period signals; and wherein said sensing period controller comprises:

a dummy cell sense amplifier circuit coupled to said first dummy memory cell and to said second dummy memory cell, said dummy cell sense amplifier circuit operative to produce a first dummy cell sense amplifier output signal and a second dummy cell sense amplifier output signal responsive to currents in respective ones of said first and second dummy memory cells;

a sensing time detecting circuit coupled to said dummy cell sense amplifier circuit and operative to produce a first sensing time signal and a second sensing time signal, respectively, in response to a transition of respective ones of said first and second dummy cell sense amplifier output signals; and a sensing period signal generating circuit coupled to said sensing time detecting circuit and operative to generate said first and second sensing period signals responsive to respective ones of said first and second sensing time signals.

24. In a memory device including a plurality of memory cells, a method of reading comprising the steps of:

applying a word line voltage to a selected memory cell and to a dummy memory cell for a sensing period having a duration dependent on a current produced in the dummy memory cell.

25. A method according to claim 24, wherein the memory device comprises a multi-level memory device, and comprising the step of:

applying a sequence of word line voltages to said selected memory cell and to a plurality of dummy memory cells having respective threshold voltages for a series of sensing periods having respective durations that are dependent on respective currents produced in respective dummy memory cells by the respective word line voltages.

26. A method according to claim 25, wherein the sequence of word line voltages comprise a first word line voltage and a second word line voltage and wherein said plurality of dummy memory cells include a first dummy memory cell having a first threshold voltage outside of the range from the first word line voltage to the second word line voltage and a second dummy memory cell having a second threshold voltage within the range from the first word line voltage to the second word line voltage.

27. A method according to claim 26, comprising the steps of:

applying said first word line voltage to the selected memory cell and to the first dummy memory cell during a first sensing period;

detecting a current in the first dummy memory cell; and terminating the first sensing period in response to the current in the first dummy memory cell meeting a predetermined first criterion.

28. A method according to claim 27, further comprising the steps of:

applying said second word line voltage to the selected memory cell and to the second dummy memory cell during a second sensing period, responsive to termination of the first sensing period;

detecting a current in the second dummy memory cell; and terminating the second sensing period responsive to the current in the second dummy memory cell meeting a predetermined second criterion.

29. A method according to claim 28, further comprising the steps of:

applying a third word line voltage to the selected memory cell during a third sensing period, responsive to termination of the second sensing period; and terminating the third sensing period responsive to a reset signal.

* * * * *